United States Patent [19]
Fauchet et al.

[11] Patent Number: 6,017,773
[45] Date of Patent: Jan. 25, 2000

[54] STABILIZING PROCESS FOR POROUS SILICON AND RESULTING LIGHT EMITTING DEVICE

[75] Inventors: Philippe M. Fauchet, Pittsford; Leonid Tsybeskov, Rochester; Karl D. Hirschmann, Henrietta, all of N.Y.

[73] Assignee: University of Rochester, Rochester, N.Y.

[21] Appl. No.: 09/054,854

[22] Filed: Apr. 3, 1998

Related U.S. Application Data

[60] Provisional application No. 60/042,688, Apr. 4, 1997.

[51] Int. Cl.$^7$ ............................. H01L 21/20; H01L 33/00
[52] U.S. Cl. ........................... 438/22; 438/505; 438/960; 438/962; 257/79; 257/103
[58] Field of Search .................................. 438/22, 27, 38, 438/503, 753, 800, 958, 960, 962; 257/79, 103

[56] References Cited

U.S. PATENT DOCUMENTS 5,427,977  6/1995  Yamada et al. .

OTHER PUBLICATIONS

"Post–Anodization Implantation and CVD Techniques for Passivation of Porous Silicon", Duttagupta et al., Mat. Res. Soc. Symp. Proc. vol. 358, pp. 381–386.

"Effect of the Gas Ambient on the Intensity of the Visible Photoluminescence From Si Microcrystallites in a $SiO_2$ Matrix Formed by Ion Implantation", Komoda et al., VIII. Oxygen/Silicon System, pp. 219–222.

"Luminescence of Rare Earth Doped Porous Silicon", Kimura et al., Mat. Res. Soc. Symp. Proc. vol. 422, pp. 149–154, Oct. 9–12, 1995.

"Structural Changes and Si Redistribution in $Si^+$ Implanted Silica Glass", Wendler et al., Nuclear Instruments and Methods in Physics Research B 116(1996), pp. 332–337.

"Effects of Surface Treatment on Light Emission from Porous Silicon", Khan et al., Mat. Res. Soc. Symp. Proc. vol. 256, pp. 143–146.

"Thermal Nitridation of p–type Porous Silicon in Ammonia", Morazzani et al., Thin Solid Films 276 (1996), pp. 32–35.

"Visible Photoluminescence From Low Temperature Deposited Hydrogenated Amorphous Silicon Nitride", Aydinli et al., Solid State Communications, vol. 98, No. 4, pp. 273–277.

"Effects of Local Ambient Atmosphere on the Stability of Electroluminescent Porous Silicon Diodes", J. Appl. Phys. 77 (11), Jun. 1, 1995, pp. 5936–5941.

"Thermal Treatment Investigations of the Photovoltage of Porous Silicon", Wang et al., 27th International SAMPE Technical Conference, pp. 534–538.

*Primary Examiner*—Charles Bowers
*Assistant Examiner*—Keith Christianson
*Attorney, Agent, or Firm*—Webb Ziesenheim Logsdon Orkin & Hanson, P.C.

[57] ABSTRACT

A method of producing light-emitting porous silicon light-emitting diode including forming a porous silicon p+ layer in a p-type silicon wafer, annealing the wafer at 800–950° C. in an atmosphere of inert gas and 1–25% oxygen, depositing a polycrystalline silicon film on the porous silicon layer, and n+ doping a portion of the polycrystalline silicon film.

19 Claims, 7 Drawing Sheets

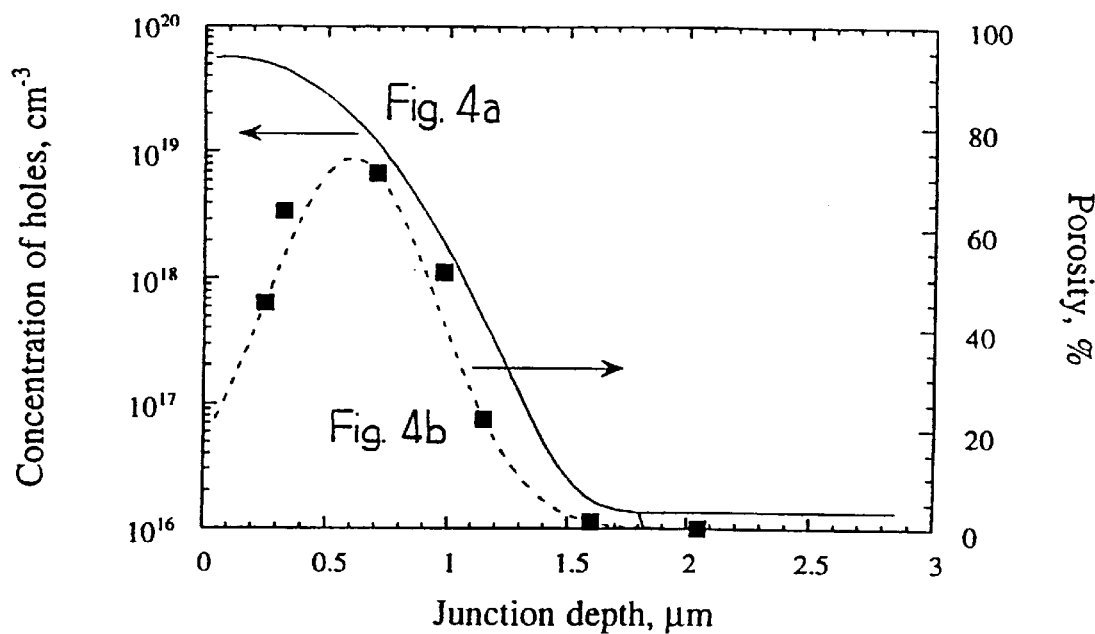
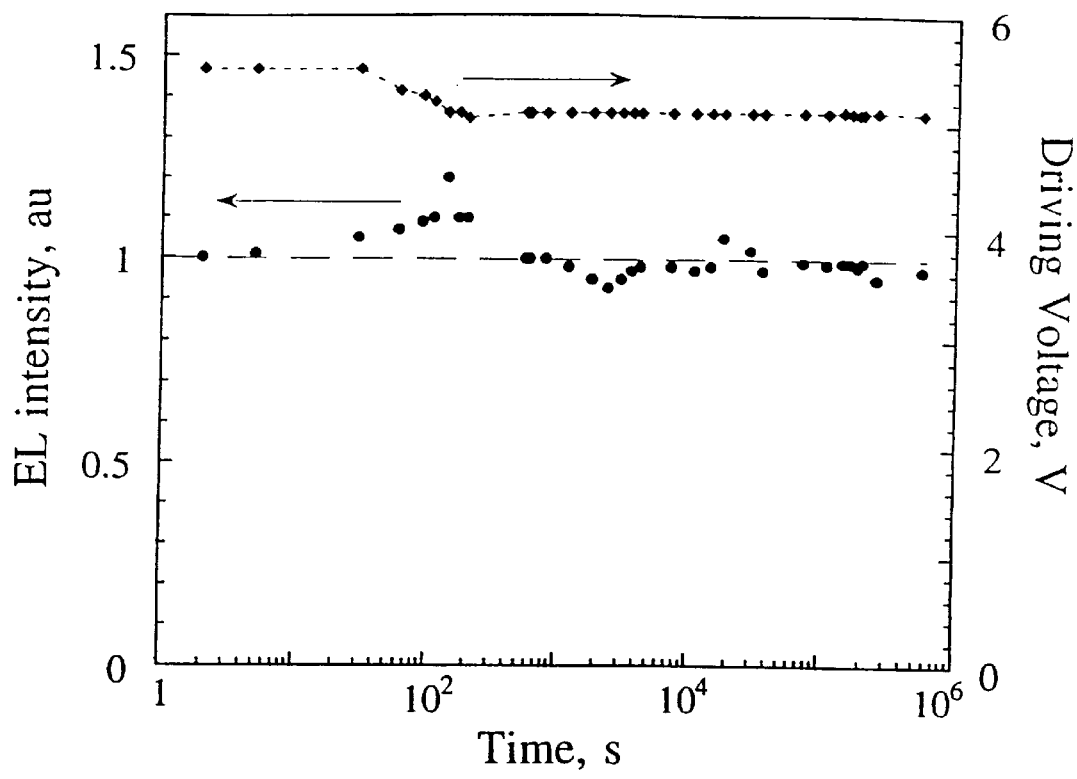
Fig. 5

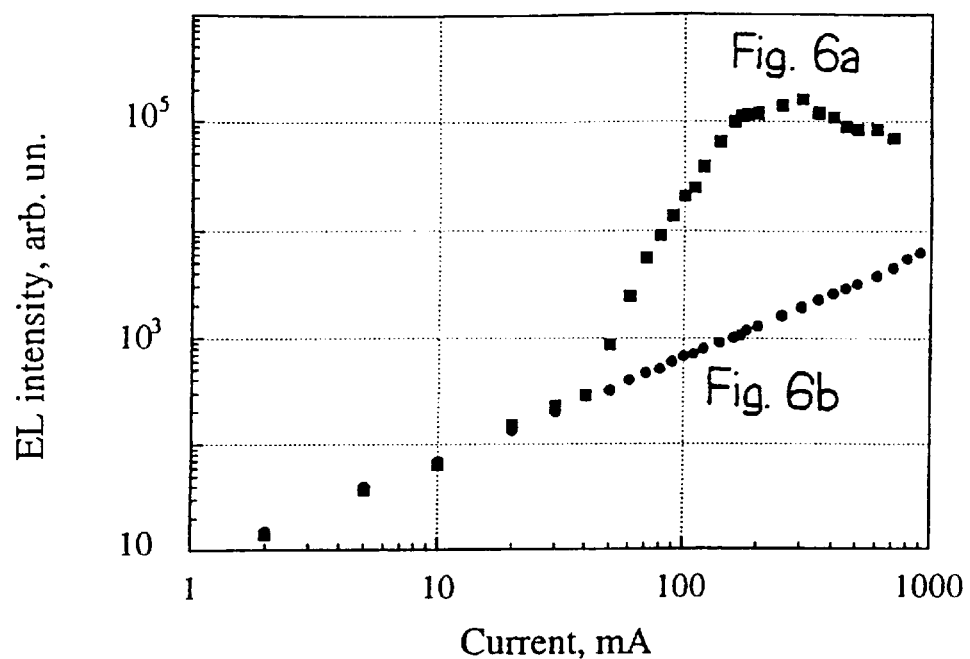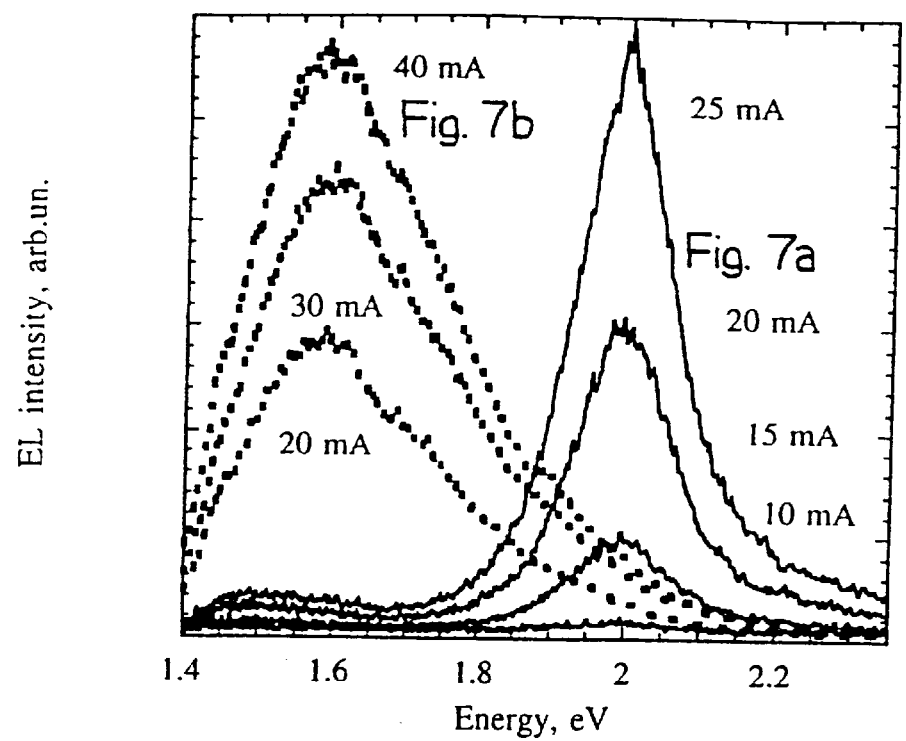

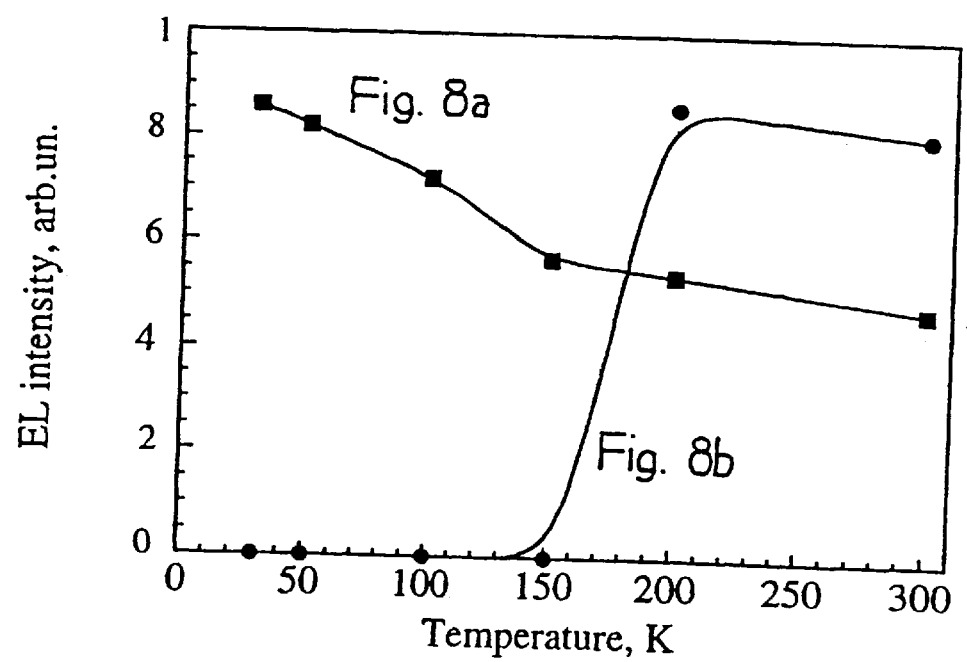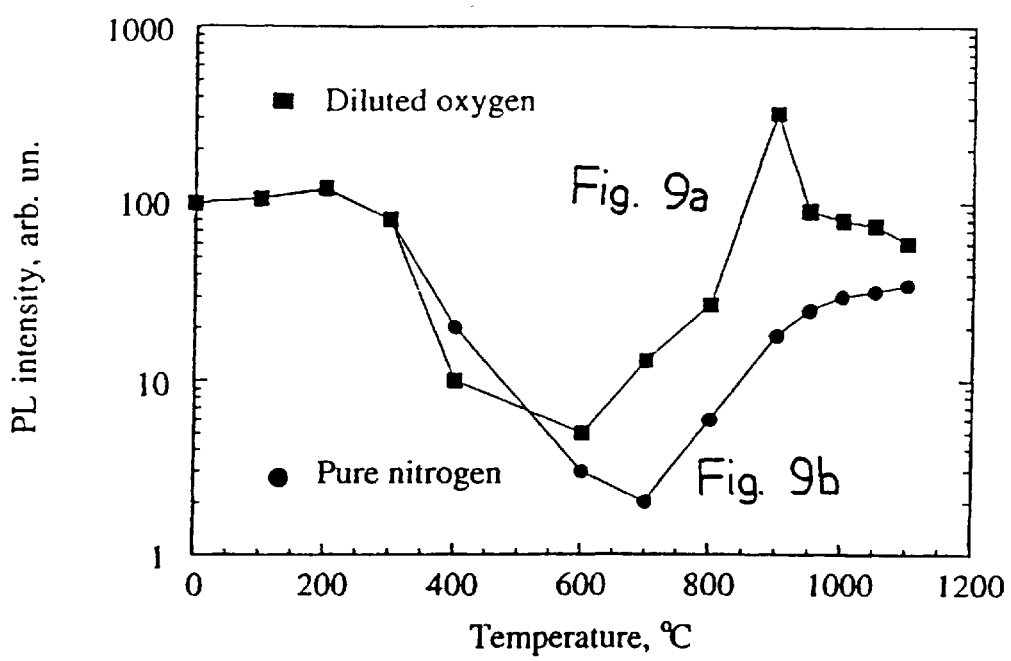

STABILIZING PROCESS FOR POROUS SILICON AND RESULTING LIGHT EMITTING DEVICE

This application claims the benefit of U.S. Provisional Application Ser. No. 60/042,688, filed Apr. 4, 1997.

BACKGROUND OF THE INVENTION

1. Field of the Invention

The present invention relates to porous silicon, more particularly to light-emitting porous silicon in a lightemitting diode.

2. Prior Art

Photoluminescent porous silicon is a material that has been known for nearly forty years. It is usually formed by electrochemical etching in a hydrogen fluoride solution under an anodic current. Porous silicon has been used in microelectronics, especially in the silicon-on-insulator technology due to its ability to be a good insulator after oxidation. Canham first reported in Silicon Quantum Wire Array Fabricated by Electrochemical and Chemical Dissolution of Wafers, *Appl. Phys. Lett.*, 57, pp. 1046–1048 (1990) that when porous silicon is further etched in hydrogen fluoride for hours after preparation, it emits bright red light under illumination with blue or UV light.

Electroluminescence (EL) was later observed in porous silicon in solution during oxidation (Halimaoui et al., Electroluminsa in the Visible Range During Anadic Oxidation of Porous Silicon Films, *Appl. Phys. Lett.*, 59, pp. 304–306 (1991)) and then in a solid state device (Richter et al., Current-Induced Light Emission from a Porous Silicon Device, *IEEE Electron Device Lett.*, 12, pp. 691–692 (1991)).

Solid state devices are presently commercially important in the electronics industry. A typical light-emitting porous silicon (LEPSi) light-emitting device (LED) includes a transparent or semi-transparent contact formed of gold or other conducting material and a 1–10 micrometer thick LEPSi layer on a crystalline silicon (c-Si) substrate. The c-Si substrate is doped with a controlled amount of impurities to form either a p-type or n-type conductor. In a p-type conductor, conduction results from movement of "holes" (absent electrons) through the material. In a n-type conductor, movement of electrons causes conduction. Threshold conditions for EL have been reported to be a voltage of at least 10 volts and a current density of at least 10 mA/cm$^2$. Unfortunately these devices exhibit low EL external quantum efficiency ($\leq 0.01\%$) and quickly degrade irreversibly.

The low efficiency and irreversible degradation of LEPSi LEDs previously rendered them unacceptable for semiconductor device applications. In particular, the stability of most LEPSi LEDs is poor. To date, LEPSi LEDs degrade within minutes when placed in air and after a few hours when placed in a moderate vacuum. The Si—H bonds that passivate the silicon nanocrystal surfaces are very fragile and can be easily broken by exposure to light, ambient air, moderate temperatures and large electric fields. Because the temperature of the LEPSi layer in a device driven well above the EL threshold can reach about 100° C. and the local electric field can be well in excess of the typical macroscopic field of $10^4$ V/cm, the Si—H bonds can be broken relatively easily and rapid degradation follows.

Accordingly, a need remains for a LEPSi device with improved stability.

SUMMARY OF THE INVENTION

In order to meet this need, the present invention is a method of producing a stable LEPSi device. The device includes a layer of light-emitting porous silicon annealed at high temperature (800–950° C.) sandwiched between a p-type silicon wafer and a highly doped n+ polycrystalline silicon film. The LEPSi device is produced by 1) forming a p+ Si layer on a p-type c-Si wafer by dopant diffusion; 2) anodizing the wafer in an aqueous solution of hydrogen fluoride; 3) annealing the wafer at high temperature in an inert atmosphere containing about 1–25% oxygen; 4) forming a polycrystalline silicon film by low pressure chemical vapor deposition followed by implantation with phosphorus ions and thermal annealing for dopant activation; and 5) mounting electrical contacts to the device.

A complete understanding of the invention will be obtained from the following description when taken in connection with the accompanying drawing figures wherein like reference characters identify like parts throughout.

BRIEF DESCRIPTION OF THE DRAWINGS

FIG. 4*a* is a graph of the boron concentration versus junction depth of the LEPSi produced in Example 1;

FIG. 4*b* is a graph of the porosity versus junction depth of the LEPSi produced in Example 1;

FIG. 5 is a graph of electroluminescence and driving voltage over time of the device produced in Example 1;

FIG. 6*a* is a graph of electroluminescence over current of the device produced in Example 1;

FIG. 6*b* is a graph of electroluminescence over current of the device produced in Comparative Example 1;

FIG. 7*a* is a graph of the electroluminescence spectra of the device produced in Example 1;

FIG. 7*b* is a graph of the electroluminescence spectra of the device produced in Comparative Example 1;

FIG. 8*a* is a graph of electroluminescence intensity versus temperature of the device produced in Example 1;

FIG. 8*b* is a graph of electroluminescence intensity versus temperature of the device produced in Comparative Example 1;

FIG. 9*a* is a graph of photoluminescence intensity versus annealing temperature for the devices produced in Example 2;

FIG. 9*b* is a graph of photoluminescence intensity versus annealing temperature for the devices produced in Comparative Example 2;

DETAILED DESCRIPTION OF THE PREFERRED EMBODIMENTS

The present invention includes a LEPSi LED which is stable over more than one week and a method for preparing the same. The LEPSi LED of the present invention is produced by the steps of 1) providing a p-type crystalline silicon wafer having two sides; 2) forming in one side of the wafer, a porous silicon p+ layer by ion implantation or diffusion; 3) anodizing the wafer to form a layer of high density porous silicon in the wafer below the p+ layer; 4) passivating the porous silicon layer; and 5) forming a polycrystalline silicon layer on a portion of the passivated porous silicon layer. The details of each of these steps are described below.

Figure 1A:
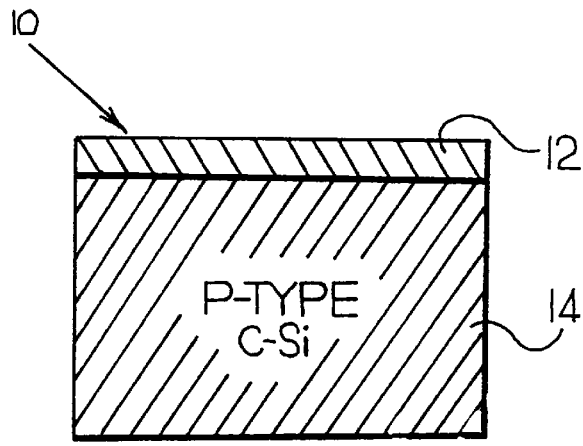
Fig. 1*a* is a sectional elevation view of a polycrystalline silicon wafer having a p+ layer formed therein.

A p-type crystalline silicon (c-Si) wafer is subjected to boron diffusion using a boron silicate glass dopant source in accordance with doping techniques established in the art. As shown in Fig. 1a, following the doping, the c-Si wafer 10 forms into a p+ layer 12 and an adjacent p-type c-Si substrate 14.

Figure 2:
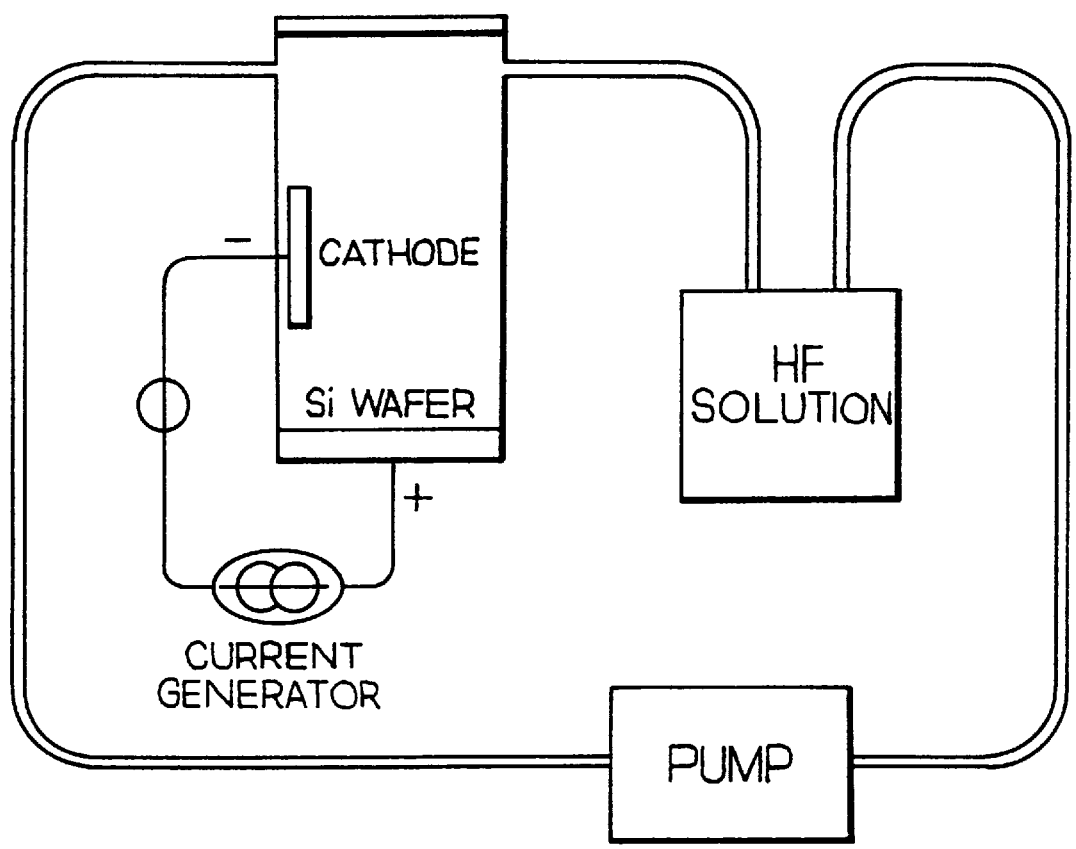
FIG. 2 is a plan view of an electrochemical cell for anodizing the LEPSi of the present invention.

The wafer 10 having the p+ layer 12 is anodized in an anodizing chamber containing an aqueous solution of hydrogen fluoride. As depicted in FIG. 2, the c-Si wafer 10 having the p+ layer 12 acts as an anode. The c-Si wafer 10 and the cathode are immersed in the aqueous hydrogen fluoride solution. Preferably, the hydrogen fluoride concentration is about 25% by weight and ethanol or methanol is added to the solution to improve the penetration of the solution into the pores of the c-Si wafer and to minimize hydrogen bubble formation. The alcohol is preferably present as 50% by weight of the solution. A current generator is provided between the cathode and the anode and maintains a constant current density, preferably between 1 and 100 mA/cm$^2$, more preferably 15 mA/cm$^2$. The hydrogen fluoride solution is circulated from a supply tank by a pump through the anodizing chamber in a continuous manner. The thickness and the photoluminescence spectrum of the resulting porous layer depend upon the p+ carriers (hole) concentration, the anodization current density, the concentration of the aqueous solution of hydrogen fluoride, the pH of the aqueous solution and the duration of the anodization.

Figure 1B:
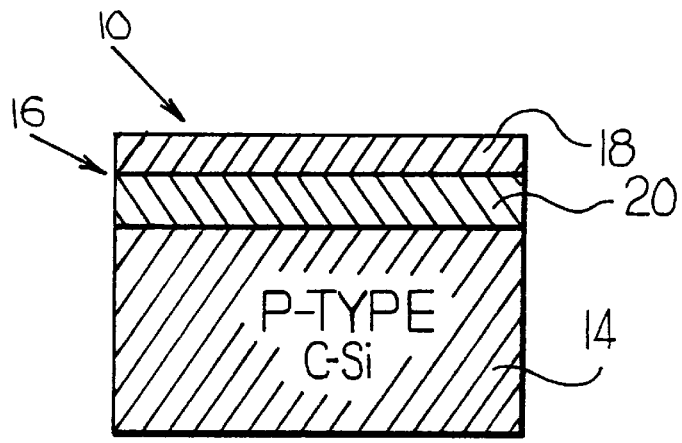
Fig. 1*b* is a sectional elevation view of the wafer depicted in Fig. 1*a*, illustrating anodization of the p+ layer.

As depicted in Fig. 1b, following anodization a double layer 16 of polycrystalline porous silicon (PSi) is formed. The p+ layer 12 in the wafer 10 becomes a layer 18 of low or moderate porosity porous silicon and a layer of the c-Si substrate 14 immediately below the p+ layer 12 becomes a layer 20 of high porosity porous silicon. The low porosity layer 18 is believed to play an important role in contact formation and to improve heat dissipation from the device.

The wafer 10 having the polycrystalline silicon layer 16 is then passivated by annealing the wafer 10 at about 800–900° C. in an atmosphere containing an inert gas and about 1–25% oxygen, preferably about 5–15% oxygen, more preferably about 10% oxygen. It is believed that this atmosphere controls the conversion of Si to $SiO_2$ and imparts an oxide thickness of a few monolayers. Preferably, the inert gas is nitrogen. During the annealing step, hydrogen atoms of the SiH of the wafer 10 are replaced by oxygen to form $SiO_2$. Preferably, the annealing process is performed for about 15–30 minutes. It is believed that passivation of a porous silicon device in a high oxygen atmosphere (over about 25% $O_2$) at low temperature (less than about 800° C.) oxidizes an insufficient amount of silicon in the device. Increasing the passivation temperature to above 800° C. in a high oxygen atmosphere produces an excessive amount of $SiO_2$. The process of the present invention balances these control parameters by passivating the wafer 10 in an atmosphere of low oxygen (about 1–25% oxygen) at high temperature (about 800–950° C.). The lower amount of oxygen in the passivation step of the present invention is believed to reduce the rate of silicon oxidation which would otherwise occur at temperatures of about 800–950° C. The amount of silicon oxidized also may be controlled according to the length of time the wafer 10 is exposed to oxygen in the passivating step. For example, a device produced in passivating atmosphere containing more than 15% oxygen should be annealed for a shorter time.

Figure 1C:
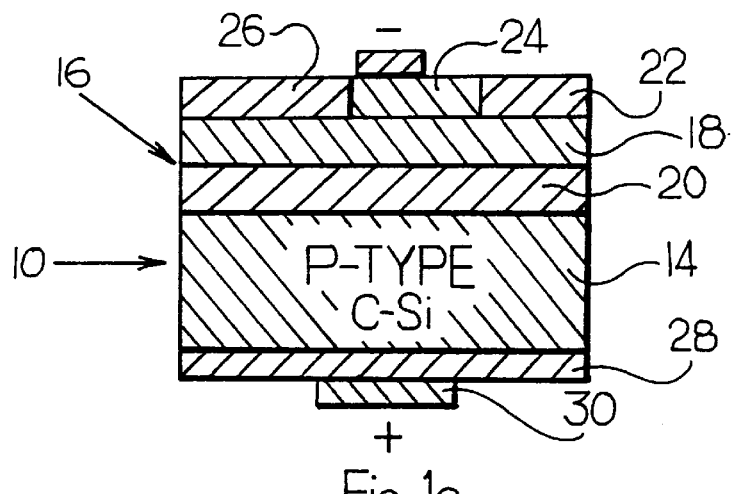
Fig. 1*c* is a sectional elevation view of a LEPSi made in accordance with the present invention.

As shown in Fig. 1c, a polycrystalline silicon (poly-Si) film 22 is deposited by conventional low pressure chemical vapor deposition (LPCVD) in a growth chamber containing silane at a pressure of several millitorrs and a temperature of about 650° C. The poly-Si film 22 is transparent in the red-infrared part of the spectrum. The poly-Si film 22 is preferably about 0.1–0.3 μm thick, more preferably about 0.1 μm thick. A thinner layer of poly-Si (0.1 μm thick) allows light produced in the wafer 10 to pass more readily therethrough than a thicker layer (0.3 μm thick), however a thicker layer has greater strength than a thinner layer. Hence, the strength and the light transmissivity of the poly-Si film 22 are determined by the film thickness. The LPCVD process is believed to not damage the previously annealed porous silicon layer 16.

The poly-Si film 22 is patterned lithographically and etched according to conventional techniques to define a contact region 24. To provide efficient electron injection during device operation, the contact region 24 is heavily doped (n+) by phosphorus ion implantation preferably at a dose of $10^{15}$ cm$^{-2}$ at an energy of 50 KeV, and actively annealed for about 10 minutes at a temperature of about 950–1000° C. to produce a low resistivity polysilicon contact. By low resistivity it is meant a maximum of 0.1 ohm cm.

A negative contact 26 is adhered to the contact region 24. Preferably the negative contact 26 includes an aluminum film. The aluminum film is sputtered, patterned and etched, and then sintered to provide good ohmic contact to the contact region 24. A p+ c-Si layer 28 is formed in the p-type c-Si substrate 14 on an opposite side of the wafer 10 from the contact region 24 by boron ion implantation or diffusion followed by thermal annealing at about 900° C. A positive contact 30 is adhered to the p+ c-Si layer 28 and preferably includes an aluminum film.

The low porosity layer 18 and the doped poly-Si film 22 are believed to provide a low concentration of interface states between the negative contact 26 and the high porosity poly-Si layer 20 with the underlying layer of p-type c-Si substrate 14. It is believed that the electroluminescence of the wafer 10 is the result of bipolar injection, wherein the highly phosphorus doped contact region 24 injects electrons and the boron doped p-type c-Si substrate 14 injects holes.

Figure 3A:
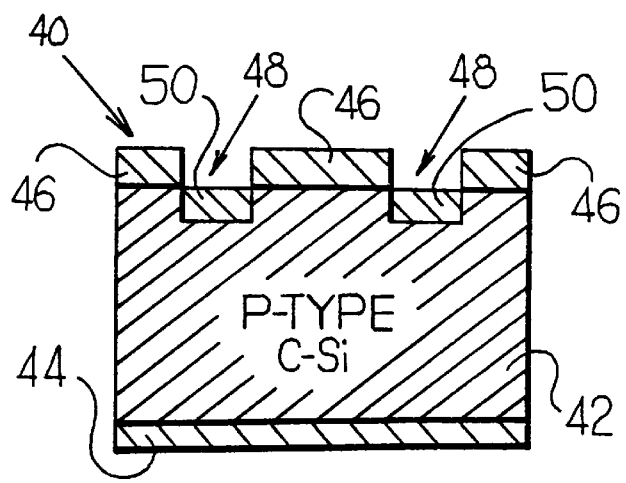
FIG. 3*a* is a sectional elevation view of a polycrystalline silicon illustrating coating of the wafer with Si$_3$N$_4$.
Figure 3B:
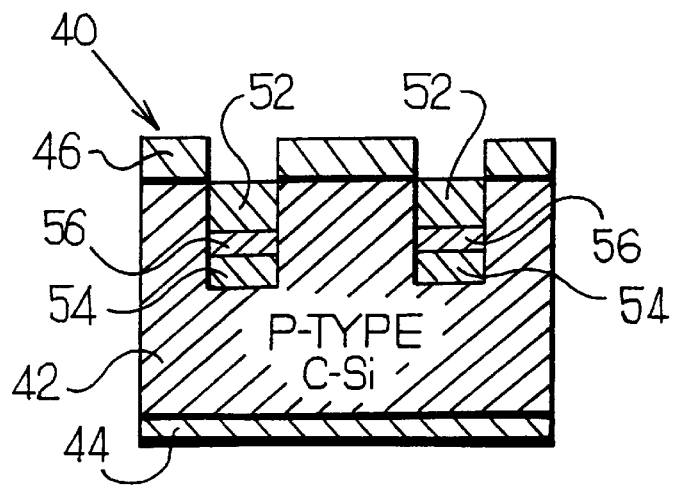
FIG. 3*b* is a sectional elevation view of the wafer depicted in FIG. 3*a* having areas of local anodization.
Figure 3C:
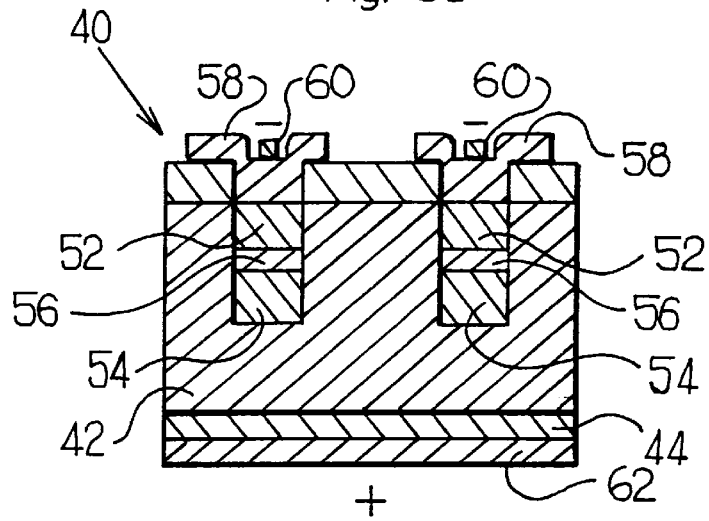
FIG. 3*c* is a sectional elevation view of a modified LEPSi made in accordance with the present invention.

FIGS. 3a–3c depict an alternative embodiment of a wafer 40 produced according to the present invention. A p-type silicon substrate 42 with a resistivity of about 10 ohm cm is doped on one side with boron to provide a low resistance p+ layer 44. A $Si_3N_4$ film 46 of preferably 1000–2000 Å thick, more preferably 1500 Å thick is deposited via LPCVD over the entire wafer. The $Si_3N_4$ film 46 is then partially removed from the other side using reactive ion etching to expose a plurality of areas of local anodization 48. The $Si_3N_4$ film 46 is also removed from the low resistance p+ layer. The areas of local anodization are doped with boron to form p+ areas 50. The wafer 40 is cleaned and annealed at about 1000° C. For about 15 minutes and pure nitrogen to activate impurities.

The wafer 40 is next anodized in an aqueous solution of HF in a manner similar to the method described above with respect to wafer 10. As shown in FIG. 3b, the p+ areas 50 form into areas of low porosity polycrystalline silicon 52 (about 40% porosity) and underlying areas of high porosity polycrystalline silicon 52 (about 75–80% porosity). An intermediate porosity polycrystalline silicon area 56 may be formed between the low porosity areas 54 and the high porosity areas 50. The wafer 40 is annealed in a low oxygen atmosphere (1–25% $O_2$) at high temperature (800–950° C.) in a manner similar to the above-described method with respect to wafer 10.

As shown in FIG. 3c, a poly-Si film 58 is deposited on the $Si_3N_4$ film 46 in and surrounding the areas of low porosity polycrystalline silicon 52 via LPCVD as described above, preferably by photolithography. The poly-Si film 58 is n+ doped. A plurality of negative contacts 60, preferably formed of aluminum, are attached to the poly-Si film 58. A positive contact 62, preferably an aluminum film, is adhered to the p+ layer 44.

Although the invention has been described generally above, particular examples give additional illustration of the products and method steps typical of the present LEPSi LED.

EXAMPLE 1

Annealing in 10% Oxygen at 950° C.

Step 1: Formation of a p+ Layer in a P-type C-Si Wafer

A p-type crystalline silicon wafer having a resistivity of 10 ohm was subjected to doping diffusion from a borosilicate glass layer at 950° C. for 20 minutes. A p+ layer was formed on a lower side of the wafer. The junction depth was determined by a numerical simulation of the diffusion equation to be approximately 0.5 μm, a value that was consistent with four-point probe measurements. The simulated profile of boron concentration after diffusion versus junction depth is presented graphically in FIG. 4a.

Step 2: Formation of the Active Region

The p-type c-Si wafer having a p+ layer produced in Step 1 was anodized for approximately two minutes in 1:1:2 solution of $HF:H_2O:C_2H_5OH$ under constant current density of 15 mA/cm$^2$ at room temperature. The estimated thickness of the porous layer was 1.2 to 1.5 μm according to a FabryPerot interference fringe measurement in the optical reflection spectrum. The porosity profile is shown in FIG. 4b as obtained from gravimetrical measurements of the porosity performed on identical samples anodized from 10 seconds to 5 minutes.

Step 3: Oxygen Passivation

The anodized wafer produced in Step 2 was annealed at 900° C. n an atmosphere of nitrogen with 10% oxygen for 20 minutes. A polycrystalline silicon film was deposited on the wafer by LPCVD at 650° C. The polysilicon film was approximately 300 nanometers thick.

Step 4: Doping of polycrystalline Silicon

The resistivity of the polycrystalline silicon film produced in Step 3 was decreased to 0.1 ohm cm by selective implantation with phosphorus ions at a dose of $10^{15}$ cm$^{-2}$ at an energy of 50 KeV followed by thermoannealing at 900° C. The polycrystalline silicon film was photolithographically patterned to define a device contact region using a contact mask.

Step 5: Contact Attachment

An aluminum upper contact was deposited on the polycrystalline layer by vacuum sputtering to a thickness of approximately 1500 Å and was sintered by annealing in forming gas (a mixture of nitrogen and oxygen) at 400° C. A p+ c-Si lower layer was formed in the c-Si wafer by implantation of boron followed by thermal annealing at 950° C. A standard aluminum contact was attached to the lower p+ c-Si layer by sputtering and sintering in forming gas at 400 ° C. The electroluminescence intensity in arbitrary units (au) of the device modulated by a square wave current pulse as a function of operation time depicted in FIG. 5 The device remained stable for over one week.

COMPARATIVE EXAMPLE 1

Annealing in Pure Nitrogen at 900° C.

A device similar to that produced in Example 1 was produced except that the annealing step occurred in an atmosphere of pure nitrogen.

The electroluminescence intensity in arbitrary units (arb. un.) of the devices produced in Example 1 and Comparative Example 1 as a function of electrical current is depicted in FIGS. 6a and 6b, respectively. The device annealed in dilute oxygen (Example 1) exhibits a power relationship between the electroluminescence intensity and current. In contrast, the device annealed in pure nitrogen (Comparative Example 1) produces a linear relationship for more than two orders of magnitude of current. The electroluminescence spectra in arb. un. of the device produced in Example 1 and Comparative Example 1 are presented in FIGS. 7a and 7b, respectively. The devices annealed in dilute oxygen (Example 1) has an electroluminescence peak at about 2 eV at 25 milliamps whereas current of 40 milliamps is required to achieve the same intensity of electroluminescence from the device annealed in pure nitrogen (Comparative Example 1), peaking at about 1.6 eV. The temperature dependence of normalized electroluminescence spectra in arb. un. of the device produced in Example 1 and Comparative Example 1 is presented in FIGS. 8a and 8b, respectively. The device annealed in dilute oxygen (Example 1) exhibits slightly increasing intensity of electroluminescence with decreasing temperature whereas the intensity of electroluminescence of the device annealed in pure nitrogen decreases dramatically with decreasing temperature.

EXAMPLE 2

Annealing in 10% Oxygen at 0–1200° C.

Devices similar to that produced in Example 1 were produced except that the annealing step for each device was performed for 25 minutes at various temperatures between 0 and 1200° C.

COMPARATIVE EXAMPLE 2

Annealing in Pure Nitrogen at 0–1200° C.

Devices similar to those produced in Example 2 were produced except that the annealing steps were performed in pure nitrogen. The photoluminescence intensity in arb. un. versus the annealing temperatures of the devices produced in Example 2 and Comparative Examples 2 are depicted in FIGS. 9a and 9b, respectively.

EXAMPLE 3

Annealing at 950° C.

A device similar to that produced in Example 1 was produced except that the annealing step was performed at a temperature of 950° C.

COMPARATIVE EXAMPLE 3

Annealing at 1050° C.

Figure 10A:
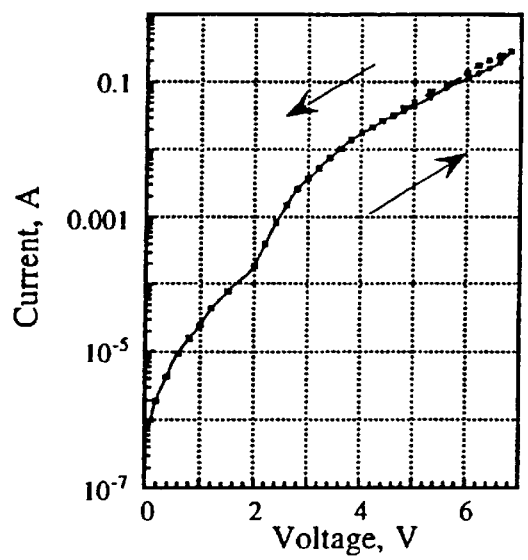
FIG. 10*a* is a graph of current versus voltage for the device produced in Example 3.
Figure 10B:
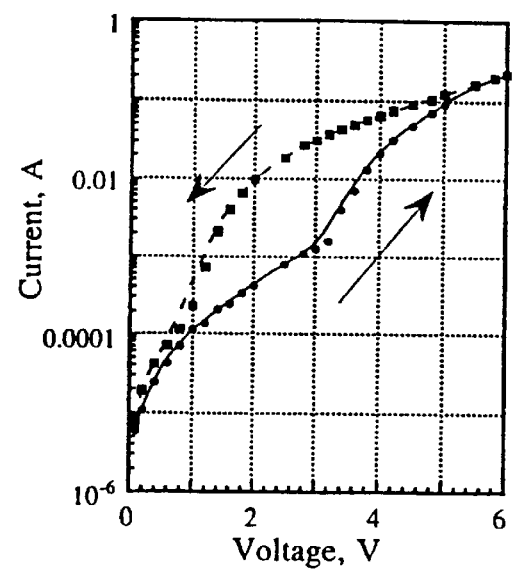
Fig. 10*b* is a graph of current versus voltage for the device produced in Comparative Example 3.

A device similar to that produced in Example 3 was produced except that the annealing step was performed at a temperature of 1050° C. The room temperature current-voltage curves of the devices produced by annealing at 950° C. and 1050° C. are presented in FIGS. 10a and 10b, respectively. When the annealing temperature is increased to 1050° C., a hysteresis in the current-voltage curve is observed.

It will be readily appreciated by those skilled in the art that modifications may be made to the invention without departing from the concepts disclosed in the foregoing description and Examples. Such modifications are to be considered as included within the following claims unless the claims, by their language, expressly state otherwise. Accordingly, the particular embodiments described in detail herein are illustrative only and are not limiting to the scope of the invention which is to be given the full breadth of the appended claims and any and all equivalents thereof.

What is claimed is:

1. A method of preparing light-emitting porous silicon comprising the steps of:
   providing a p-type crystalline silicon wafer having two sides;
   forming a porous silicon layer in one side of the wafer;
   annealing the porous silicon layer at about 800–950° C. in an atmosphere containing an inert gas and about 1–25% oxygen; and
   forming a polycrystalline silicon film on a portion of the annealed porous silicon layer.

2. A method of preparing light-emitting porous silicon as claimed in claim 1 wherein the atmosphere contains about 5–15% oxygen.

3. A method of preparing light-emitting porous silicon as claimed in claim 2 wherein the atmosphere contains about 10% oxygen.

4. A method of preparing light-emitting porous silicon as claimed in claim 1 wherein said step of forming a porous silicon layer comprises anodizing the wafer in a hydrogen fluoride solution.

5. A method of preparing light-emitting porous silicon as claimed in claim 1 wherein said inert gas is nitrogen.

6. A method of preparing a light-emitting porous silicon device comprising the steps of:
   providing a p-type crystalline silicon wafer having two sides;
   forming a porous silicon layer in one side of the wafer;
   annealing the porous silicon layer at about 800–950° C. in an atmosphere containing an inert gas and about 1–25% oxygen; and
   forming a polycrystalline silicon film on a portion of the annealed porous silicon layer,
   wherein said step of forming a polycrystalline silicon film comprises depositing silicon by low pressure chemical vapor deposition.

7. A method of preparing light-emitting porous silicon device as claimed in claim 6 wherein said step of depositing the polycrystalline silicon film is performed at about 650° C.

8. A method of preparing light-emitting porous silicon device as claimed in claim 6 of further comprising n+ doping the polycrystalline silicon layer.

9. A method of preparing light-emitting porous silicon device as claimed in claim 8 wherein said step of n+ doping comprises implanting phosphorus into the polycrystalline film.

10. A method of preparing a light-emitting porous silicon light-emitting diode comprising the steps of:
    providing a p-type crystalline silicon wafer having two sides;
    forming a porous silicon layer in a portion of one side of the wafer;
    annealing the porous silicon layer at about 800–950° C. in an atmosphere containing an inert gas and about 1–25% oxygen;
    forming a polycrystalline silicon film on a portion of the annealed porous silicon layer; and
    forming an electrode on each of the polycrystalline silicon film and the other side of the wafer.

11. The method of preparing a light-emitting porous silicon light-emitting diode claim 10 wherein the atmosphere contains about 5–15% oxygen.

12. The method of claim 11 wherein the atmosphere contains about 10% oxygen.

13. A method of preparing light-emitting porous silicon as claimed in claim 10 wherein said inert gas is nitrogen.

14. A method of preparing light-emitting porous silicon as claimed in claim 10 wherein said step of forming a polycrystalline silicon film comprises depositing silicon by low pressure chemical vapor deposition.

15. A method of preparing light-emitting porous silicon as claimed in claim 10 wherein said step of depositing an electrode on the polycrystalline silicon layer comprises applying a metal film on the polycrystalline silicon layer.

16. A method of preparing light-emitting porous silicon as claimed in claim 15 wherein said step of forming an electrode on the other side of the wafer comprises forming a p+ layer in the other side of the wafer, annealing the p+ layer and depositing a metal film on the p+ layer.

17. A light-emitting porous silicon device comprising:
    a p-type crystalline silicon wafer having two sides;
    a porous silicon layer formed in a portion of one side of said wafer; and
    a polycrystalline silicon film covering a portion of said porous silicon layer, wherein said device is adapted to produce stable electroluminescence for one week when current is applied to said device.

18. A device as claimed in claim 17 further comprising a negative electrode connected to said polycrystalline silicon film and a positive electrode connected to the other side of said wafer.

19. A device as claimed in claim 17 wherein said porous silicon layer is formed by annealing said wafer at about 800–950° C. in an atmosphere containing an inert gas and 1–25% oxygen.

* * * * *

UNITED STATES PATENT AND TRADEMARK OFFICE
CERTIFICATE OF CORRECTION

PATENT NO.  : 6,017,773
DATED       : January 25, 2000
INVENTOR(S) : Philippe M. Fauchet et al.

It is certified that error appears in the above-identified patent and that said Letters Patent is hereby corrected as shown below:

Column 1 Line 12 "lightemitting" should read --light-emitting--.

Column 1 Line 44 "a n-type" should read --an n-type--.

Column 3 Line 64 after "device" insert period --.--.

Column 4 Line 66 "For" should read --for--.

Column 4 Line 66 "and pure" should read --in pure--.

Column 5 Line 58 "900°C. n" should read --900°C. in--.

Column 6 Line 16 "time depicted" should read --time is depicted--.

Column 6 Line 16 after "FIG. 5" insert period --.--.

Column 8 Line 8, Claim 8, "6 of further" should read --6 further--.

Column 8 Line 27, Claim 11, "diode claim 10" should read
    --diode as claimed in claim 10--.

Signed and Sealed this

Fourteenth Day of November, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO.    : 6,017,773
DATED         : January 25, 2000
INVENTOR(S)   : Fauchet et al.

It is certified that error appears in the above-identified patent and that said Letters Patent is hereby corrected as shown below:

Column 1,
Line 7, insert the following paragraph, -- The present invention was made at least in part with funding received from the U.S. Army Research Office under grant DAAH04-96-1-0086. The U.S. Government may have certain rights in this invention. --
Line 12, "lightemitting" should read -- light-emitting --.
Line 44, "a n-type" should read -- an n-type --.

Column 3,
Line 64, after "device" insert -- . --.

Column 4,
Line 66, "For" should read -- for --.
Line 66, "and pure" should read -- in pure --.

Column 5,
Line 58, "900°C. n" should read -- 900°C. in --.

Column 6,
Line 16, "time depicted" should read -- time is depicted --.
Line 16, after "FIG. 5" insert -- . --.

Column 8,
Line 8, "6 of further" should read -- 6 further --.
Line 27, "diode claim 10" should read -- diode as claimed in claim 10 --.

Signed and Sealed this

Thirteenth Day of July, 2004

JON W. DUDAS
*Acting Director of the United States Patent and Trademark Office*